United States Patent [19]

Heeren

[11] 4,207,616

[45] Jun. 10, 1980

[54] LOGIC ARRAY HAVING IMPROVED SPEED CHARACTERISTICS

[75] Inventor: Richard H. Heeren, Palatine, Ill.

[73] Assignee: Teletype Corporation, Skokie, Ill.

[21] Appl. No.: 964,568

[22] Filed: Nov. 29, 1978

[51] Int. Cl.² .................. G11C 11/40; G11C 13/00
[52] U.S. Cl. ................................. 365/189; 307/205
[58] Field of Search ............ 307/205, 207; 365/189, 365/205, 230

[56] References Cited

U.S. PATENT DOCUMENTS

| 3,982,138 | 9/1976 | Luisi et al. ............... | 307/205 |
| 4,025,799 | 5/1977 | Cox et al. ................. | 365/189 |

Primary Examiner—Terrell W. Fears
Attorney, Agent, or Firm—W. K. Serp; J. C. Albrecht

[57] ABSTRACT

An integrated circuit Read-Only Memory (ROM) with improved speed of operation is disclosed as generally representative of similarly improved logic arrays. The ROM includes parallel rows of conductors oriented normal to parallel doped regions which form column conductors. The ROM is implemented with field-effect transistors and comprises two decoder fields and a data field. The transistors of the decoder fields serve to define open circuits between adjacent column conductors in accordance with binary input signals applied to the decoder fields. In the illustrative ROM, a first column conductor is connected to a return terminal of a power supply and a second column conductor is connected to a "pull-up" circuit. The illustrative circuit provides for the connection of power supply return connections to both ends of the one column conductor and provides for the connection of pull-up circuits to both ends of the second column conductor. The row conductors are connected to gates of transistors in both the data and the decoder fields and a low impedance path from the pull-up circuits to the power supply return is established in response to signals on the row conductors.

10 Claims, 8 Drawing Figures

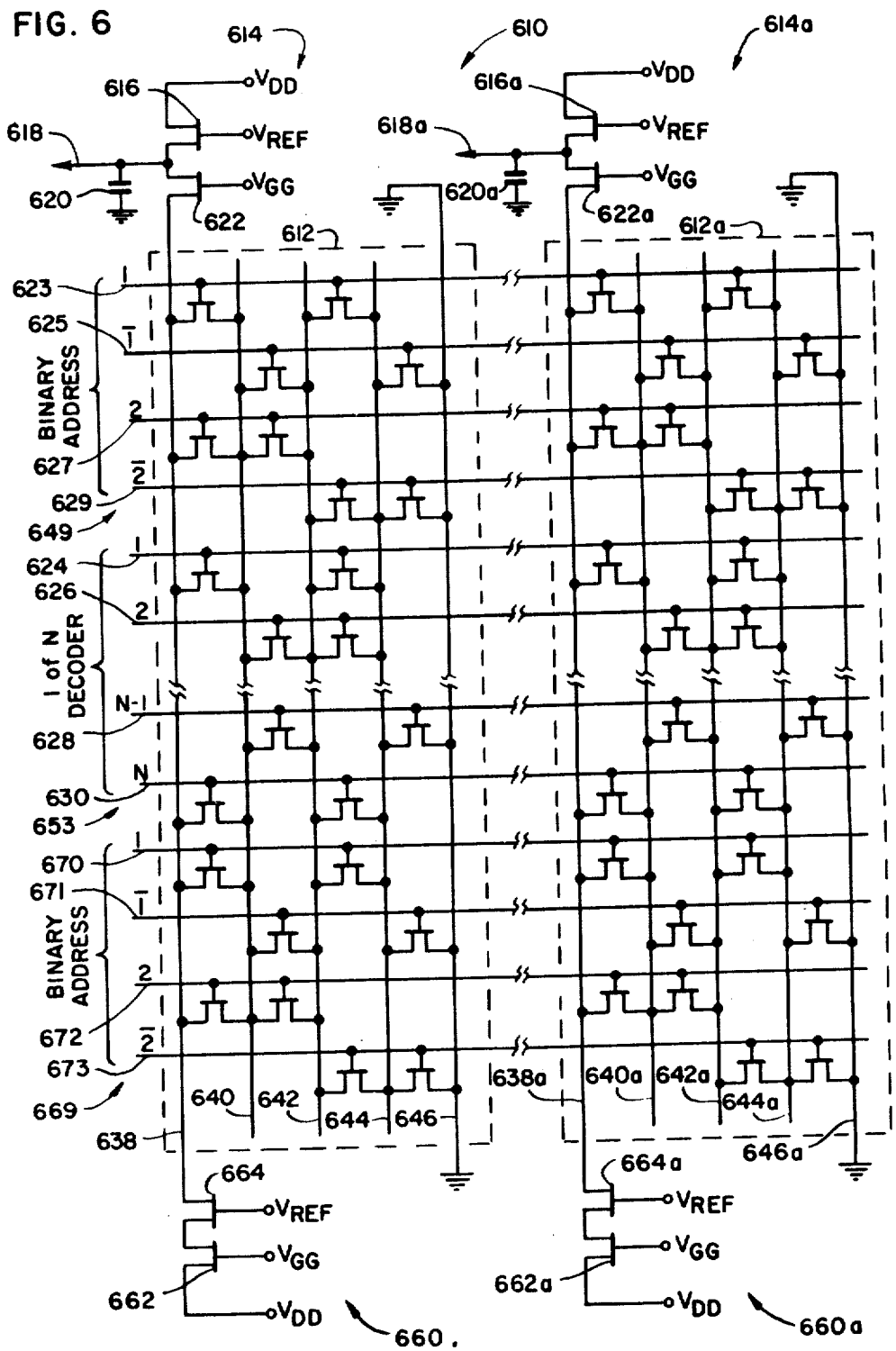

LOGIC ARRAY HAVING IMPROVED SPEED CHARACTERISTICS

DESCRIPTION

TECHNICAL FIELD

This invention relates to relatively large integrated arrays of field-effect transistors which are operated with ratio signal sensing circuits.

BACKGROUND ART

The term logic array, as used in this application, means read-only memories (ROM's), programmed logic arrays (PLA's) and random access read-write memories (RAM's). In the read-only memory (ROM) to be described, the level of the output voltage at the output node is dependent upon the ratio of the load impedance of the output circuit and the impedance of the output circuit and the impedance of the network of the array. Such networks are arranged in conductive columns and rows with field-effect transistors selectively located in accordance with the data to provide a current path between two columns which are selected in response to signals on row conductors. A logic array having such an arrangement is described in U.S. Pat. No. 3,618,050, issued Nov. 2, 1971, to R. H. Heeren and entitled "Read-Only Memory Arrays In Which A Portion of the Memory-Addressing Circuitry is Integral to the Array."

An integrated circuit logic array exhibits considerable distributed resistance and parasitic capacitance. Current flows through a relatively high load impedance and is switched to the supply return in a predetermined sequence by the transistor network. The output voltage level from the array is determined by the current path through the network. The network, when in its conductive state, has considerable resistance; therefore, a relatively high load impedance is used to assure that the output voltage will fall to a sufficiently low level for all possible paths through the network. The array capacitance and external load capacitance are quite large. These capacitances are in parallel with the output node of the array and when combined with a high load resistance, produce a long charge rate time constant which adversely affects the speed of the array. One attempt at reducing the effect of capacitance on the switching speed of a ratioed logic array is described in U.S. Pat. No. 3,944,848 issued Mar. 16, 1976, to R. H. Heeren and entitled "Voltage Sensitive Isolation for Static Logic Circuit." Certain features of this reference are included in the illustrated embodiment.

DISCLOSURE OF THE INVENTION

In accordance with this invention, a plurality of addressable row conductors are oriented normal to a plurality of parallel column conductors each having a resistive value. A first column conductor is an output conductor terminated at a first end by a "pull-up" output circuit including a load resistance. A second "pull-up" circuit is connected to a second end of the first conductor thereby decreasing the maximum resistance between any selected location on said first column conductor and the point of connection to one of said "pull-up" circuits. One end of a second column conductor is connected to a supply reference potential to provide a return for the current flow through the array. A plurality of selectively positioned transistors are responsive to signals on the row conductors for selectively providing a conductive path between said first and second column conductors.

Preferably, a second supply return connection is made to the remaining end of the second column conductor. A first group of row conductors are addressed by a first decoder signal and a second group of row conductors having substantially the same transistor locations are addressed by the first decoder signal thus establishing an open circuit or "gap" between a selected pair of adjacent column conductors.

THE DRAWINGS

FIG. 6 is a diagram of a logic array including certain features of this invention.

Figure 7A:
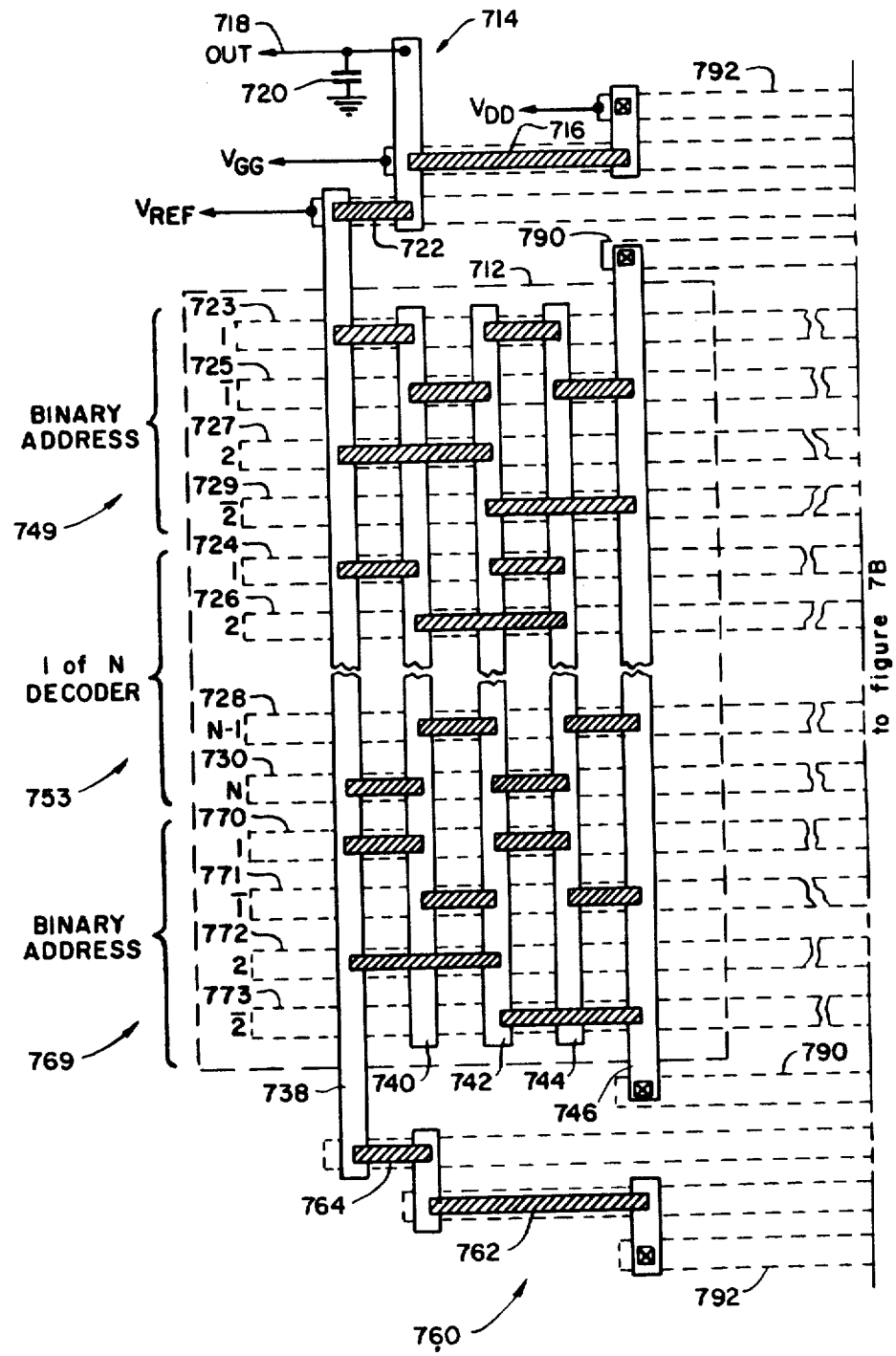
Figure 7B:
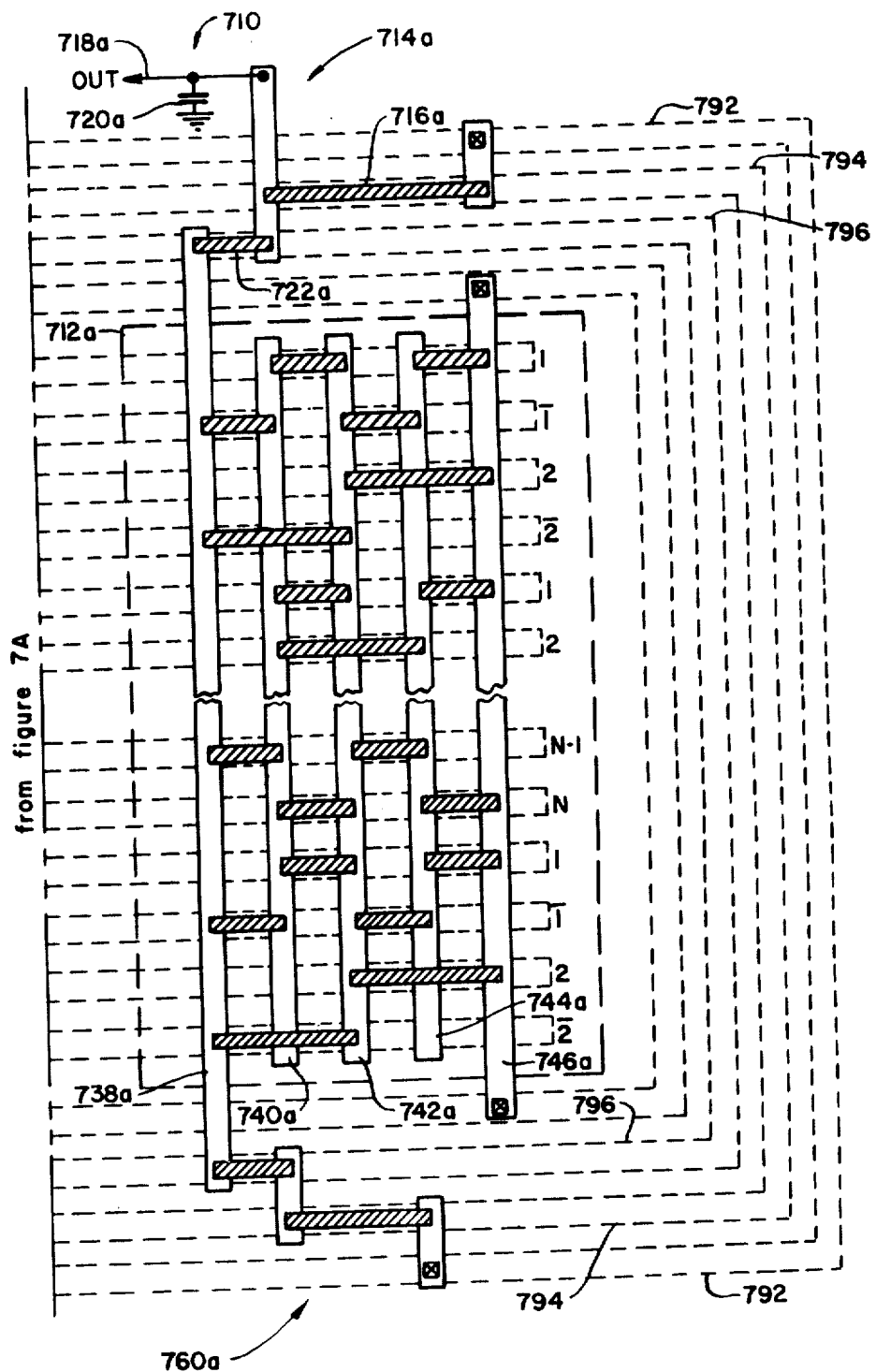

FIGS. 7A and 7B provide a symbolic illustration of the circuit of FIG. 6 as implemented in metal oxide silicon (MOS) technology.

DETAILED DESCRIPTION

Prior Art

Figure 1:
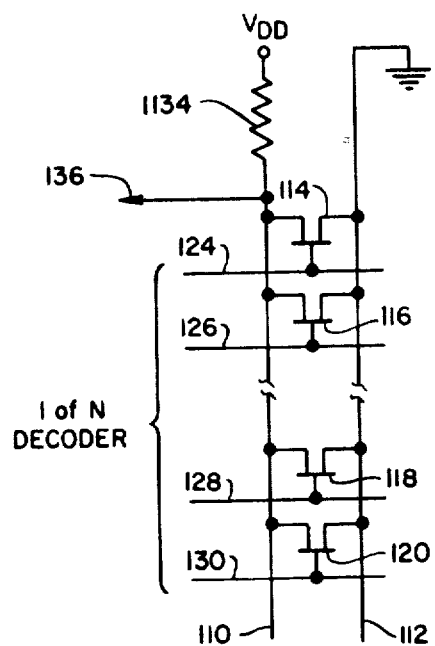
FIG. 1 is a schematic diagram of a portion of a prior art logic array.
Figure 2:
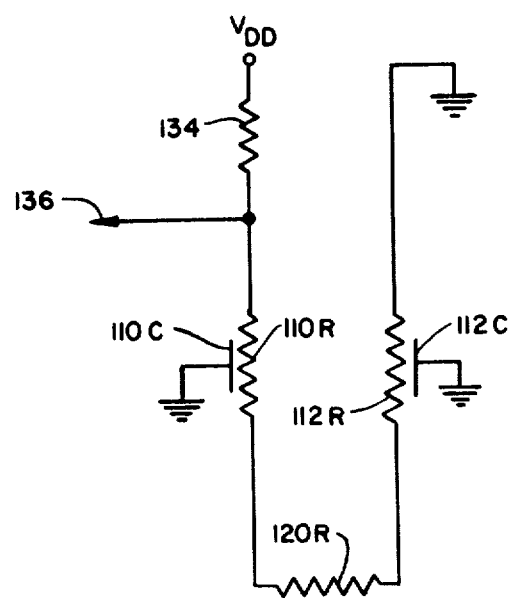
FIG. 2 is a representation of certain characteristics of the components illustrated in FIG. 1 in a selected operational mode.

A simplified portion of a prior art logic array is illustrated in FIGS. 1 and 2. Two parallel column conductors 110 and 112 have connected thereacross the electrodes of several field-effect transistors 114, 116, 118, and 120 with the gates of the transistors selectively energized by the output of a one of N decoder (not shown) through parallel row conductors 124, 126, 128, and 130. One end of the column conductor 110 is connected through a "pull-up" load resistor 134 to $V_{DD}$ potential and one end of the column conductor 112 is connected to the power supply return. When the transistor 114 is "ON", the resistance introduced by the row conductors 110 and 112 is minimum. However, when transistor 120 is "ON", the full resistance of the row conductors are in series. The series resistance of each column conductor being assigned the value R. To assure that the voltage at an output node 136 will be sufficiently low when the addressed transistor 120 is "ON", the load resistor 134 must have a relatively high value. This "worst case" situation is illustrated in FIG. 2 with the column conductor resistances 110R and 112R in series with the transistor resistances 120R. The ratio of the sum of the series resistances 110R, 112R, 120R to the load resistance 134 determines the low value of the steady state output voltage at node 136. Additionally, the conductors 110 and 112 exhibit parasitic capacitances 110C and 112C. When the current flow through the circuit is interrupted, the parasitic capacitance 110C charges through the load resistance 134. The time period required to charge the capacitor is directly related to that portion of the series resistance of the column 110 in series with the load resistance 134 with a lower value providing a higher frequency response.

Figure 3:
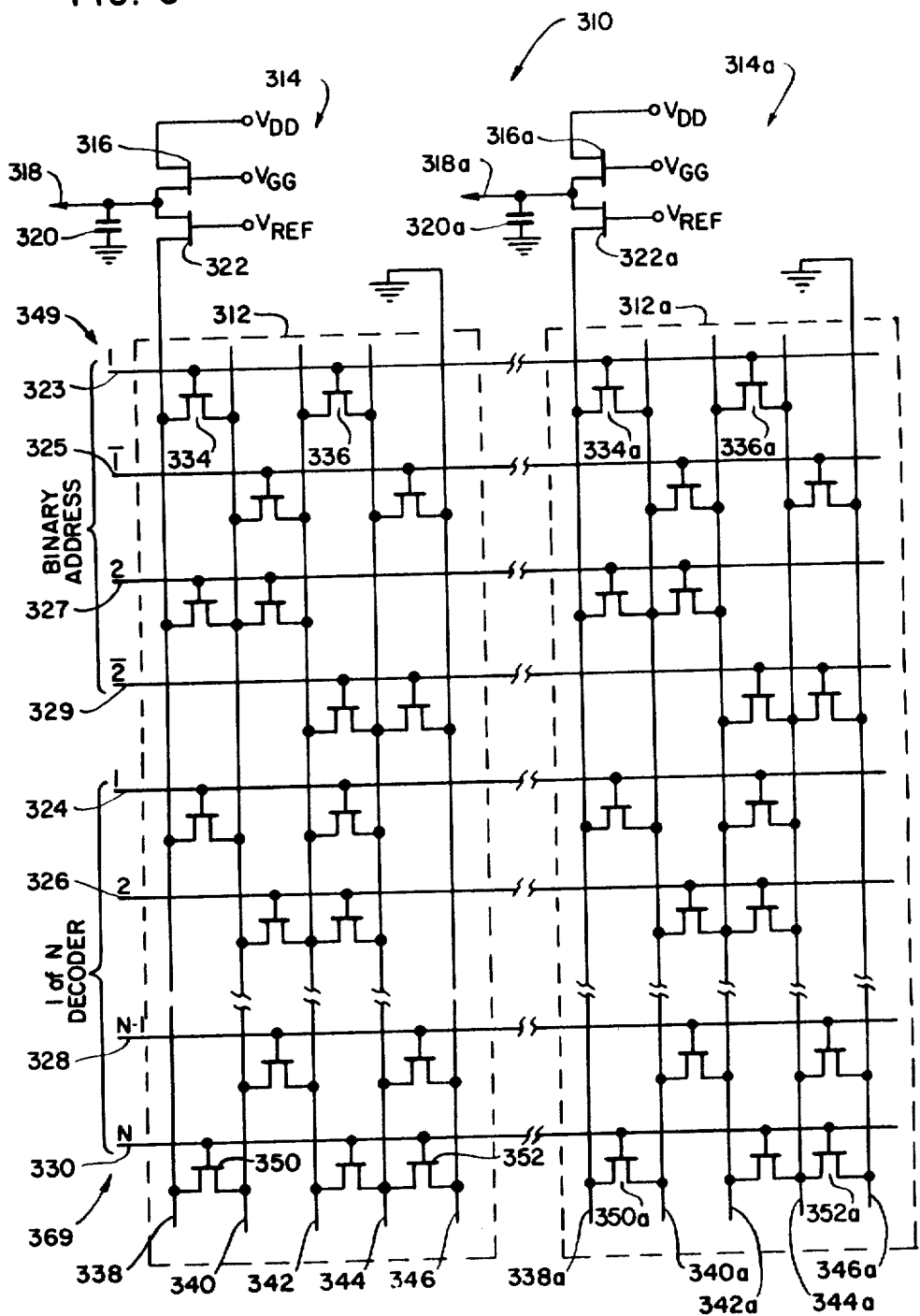
FIG. 3 is a circuit diagram of a prior art logic array.

FIG. 3 is a schematic diagram of a prior art ratioed logic array 310 including two networks 312 and 312a.

The network 312 includes an output circuit 314 having a field-effect transistor 316 connected as a load impedance the resistance of which is established by the $V_{GG}$ voltage level. The source of the FET 316, is connected to a $V_{DD}$ potential and the drain feeds an output node 318 which is connected to an external load (not shown). A load capacitance 320 appears-between the output node 318 and the power supply return. Additionally, the output circuit includes a second FET 322 which serves to establish a voltage level to which the distributed capacitance of the logic network 312 is allowed to charge. The characteristics of the FET 322 is such that conduction will be interrupted when the drain potential is within one threshold level of the base voltage which is maintained at $V_{REF}$. Thus, when the current flow through the network 312 is interrupted, the distributed parasitic capacitance of the logic network 312 will charge through transistors 316 and 322 from $V_{DD}$ to a value one threshold below $V_{REF}$. Thereafter, the network 312 is effectively disconnected from the output node 318 allowing the output voltage to rise at an increasing rate. For a more detailed description of the operation of a similar output circuit the reader is directed to the aforecited Heeren Pat. No. 3,944,848. The second network 312a of the array of FIG. 3 is connected to a similar output circuit 314a and components of the network 312a and output circuit 314a having similar operational functions to the network 312 and output circuit 314 are designated by the same numeral with the suffix "a".

The network 312 may be visualized as including a first field 349 consisting of row conductors 323, 325, 327, and 329 each being connected to the base of selected field-effect transistors. For example, row conductor 323 is connected to the base of transistors 334 and 336. At right angles to the row conductors and isolated therefrom are parallel column conductors 338, 340, 342, 344, and 346, across which are connected the electrodes of the array transistors. For example, the source of transistor 334 is connected to column conductor 338 and the drain of this transistor is connected to column conductor 340. The column conductor 338 of the array is connected to the drain of the switching FET 322 of the output circuit 314 and column conductor 346 is connected at one end of the power supply return. Thus, a conductive path through the network 312 brings the voltage at the output node 318 low. To attain this voltage level at least one "ON" FET must subtend each pair of adjacent column conductors 338-340, 340-342, 342-344, and 344-346.

The row conductors are arranged in two separate groups or fields according to the addressing scheme. As previously mentioned, the first field 349 includes conductors 323, 325, 327, and 329 which are addressed with a binary signal the direct and complement outputs of a binary signal. In response to this binary address, certain selected FETs will be in their "ON" condition effectively connecting adjacent column conductors while other FETs will be "OFF". The transistors are located so that for each binary address all of the FETs will be "OFF" across a pair of adjacent column conductors producing a "gap" in the conductive path through the network 312. This "gap" between the adjacent column conductors is selectively closed by transistors in a second or data field 369 including FETs 350 and 352 which are switched in response to signals on the row conductors 324, 326, 328, and 330. These row conductors are addressed by a one of N decoder which places a signal on one of the row conductors actuating all the FETs having their base connected to that row conductor. In the event an "ON" FET is across the conductive "gap", current will flow through the network 312 pulling the voltage level at the output node 318 low. As the decoder signals step, the "gap" in the network 312 is re-established. It will be appreciated that the output voltage at node 318 rises at a rate substantially determined by the resistance of the FET 316 and the size of the output capacitance 320 and parasitic array capacitance.

The column conductor 346 serves as a common supply return for the logic network 312 and presents maximum resistance when a FET 352, which is a maximum distance from the return connection, provides current flow between the conductors 346 and 348. The total resistance of the column conductor 346 in this situation is represented as R. Similarly, when a FET 350 is "ON" current flows through the entire length of column conductor 338 and the maximum resistance of conductor 338 is in series with the load resistance, i.e. FET 316. For purposes of discussion, the resistance of the first column conductor is also represented as an R. The total "worst case" maximum resistance introduced by both column conductors 338 and 346 being 2R. To accommodate this "worst case" condition, the resistance of FET 316 is set relatively high to assure that the voltage at the output node 318 will be sufficiently low when the logic network 312 is conducting. However, as previously mentioned, a high load resistance is disadvantageous since it increases the time required to charge the output capacitor 320 as well as the parasitic capacity of the logic network 312 and thus decreases the overall frequency response to the array 310.

Preferred Embodiment

Figure 4:
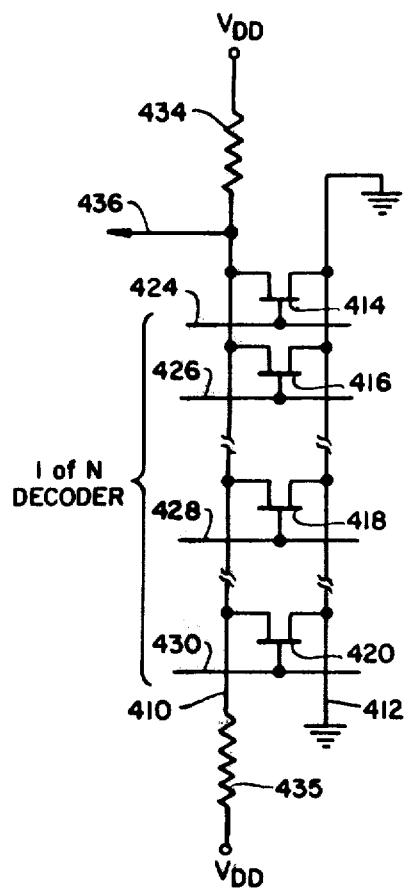
FIG. 4 is a schematic diagram of a portion of a logic array.

Illustrated in FIG. 4 is a portion of a logic array similar to the circuit of FIG. 1 including certain features which increases the speed of the network. Both ends of the row conductor 412 are connected to the power supply return and both ends of row conductor 410 are connected to $V_{DD}$ through "pull-up" resistors 434 and 435. Transistors 414, 416, 418, and 420, subtend the column conductor 410 and 412 and are switched by signals on row conductors 424, 426, 428, and 430 generated by a one of N decoder (not shown). The maximum resistance introduced by the column conductor 412 will occur when a transistor in the center of the conductor is "ON". In such a situation, the two halves of conductor 412 are effectively in parallel. That is, conductor resistors 412RA and 412RB will be in parallel. The total effective resistance being R/4 i.e. R/2+R/2. This decrease in the maximum series resistance of the logic network to the $V_{DD}$ potential allows a proportional decrease in the value of load resistors 434 and 435 as compared to the circuit of FIG. 1. The dynamic charging of the parasitic capacitances 410CA, 410CB, 418C, 412CA and 412CB is accomplished more quickly since the resistance through which these capacitances are charged has been substantially reduced.

The components of FIG. 6 which correspond to those of FIG. 3 are indicated by the same units and tens digit with a hundreds level corresponding to the figure numeral. The output column conductor 638 is connected at its second end to a voltage "pull-up" circuit 660 of similar construction to the output "pull-up" circuit 614. The "pull-up" circuit 660 includes a transistor 662 biased to serve as a load resistor as well as an array decoupling FET 664 which decouples the network 612 from the "pull-up" circuit 660 in a manner similar to that described in connection with the FET 322 of FIG. 3.

The group 649 of row conductors 623, 625, 627, and 629 are addressed by a binary signal as are the group 669 of the row conductors 670, 671, 672, and 673. Both decoder sections 649 and 669 addressed by the binary signal have identical transistor configurations. Thus, the decoder sections 649 and 669 of the network 612 respond in unison to establish an open circuit or "gap" which is shorted by the transistors switched in response to a stepped decoder signal applied to the data field 653 which includes row conductors 624, 626, 628, and 630. In practice, the fields 649 and 669 contain relatively few transistors and correspondingly few row conductors as compared to the data field 653 which may have an extremely large number of transistors and row conductors.

Figure 5:
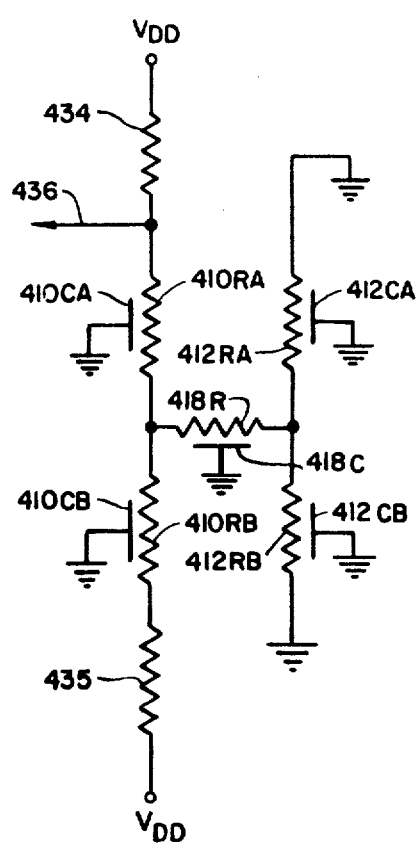
FIG. 5 is a representation of certain characteristics of the components illustrated in FIG. 4 in a selected operational mode.

In a manner similar to that previously described in connection with the circuit of FIGS. 4 and 5, both ends of the column conductor 648 are connected to the power supply return. Thus, current flows through the "ON" transistor addressed by the decoder signal on rows 624, 626, 628, and 630 and through the parallel paths established by the column conductors 638, 640, 642, 644, and 646 and to the supply return through the decoder sections 649 and 669 of the network 612. Since the column conductors adjacent the "gap" each provide parallel paths to the $V_{DD}$ "pull-up" circuits 614, 660 as well as parallel paths to the supply return, the "worst case" resistance is approximately one-fourth that of the circuit of FIG. 3. The dynamic charge time of the parasitic capacitance of the logic network is further reduced by the second "pull-up" circuit 660. In a manner similar to that discussed a connection with a circuit of FIGS. 4 and 5, the location of the "pull-up" circuit 660 reduces the resistance from $V_{DD}$ to the parasitic capacitance of the array. This reduction in series resistance allows the array capacitances to charge more quickly.

The characteristics of the circuit of FIG. 6 will be more fully appreciated after consideration of FIGS. 7A and 7B which illustrate certain features of this circuit as implemented in metal oxide silicon (MOS) technology. In FIG. 7 metallic runs are indicated by a dashed line whereas doped regions are in solid outline. The gate oxide of each transistor is indicated by a crosshatched area and an interconnection between two crossing elements is shown with a small box having an "X" inserted therein. The physical components which correspond to the symbolic components of FIG. 6 are indicated by a reference numeral with the same units and tens digits and with the hundreds digit corresponding to the figure numeral, that is, the numeral seven.

The network 712 includes a decoder field having conductors 723, 725, 727, and 729. Extending normal to the row conductors are doped regions forming column conductors 738, 740, 742, 744, and 746. A metallic conductor 790 is "U" shaped and passes along on three sides of the array 710. The conductor 790 is connected to both ends of each of the doped regions 746 and 746a providing a power supply return for each of the networks 712 and 712a.

The second "pull-up" circuit 760 of the network 712 is placed on the side of the array opposite the first "pull-up" circuit 714. Each of the arrays are commonly connected by parallel metallic runs 792, 794, and 796, which are also "U" shaped and directed about three sides of the array. Metallic runs 792, 794, and 796, respectively, provide the $V_{DD}$, $V_{GG}$, and $V_{REF}$ voltages for the "pull-up" circuits 713, 714a, 760, and 760a. It will be appreciated that the illustrated configuration increases the physical area occupied by the total array due to the routing of the metallic conductors 790, 792, 794, and 796, as well as the placement of the "pull-up" circuits 714, 714a, 760, and 760a, at both sides of the array. The addition of the row conductors 770, 771, 772, and 773 comprising the second data field 769 of the array further increases the area covered by the circuit. This arrangement is contrary to the teachings of the prior art which places considerable importance upon maintaining the smallest possible wafer area by running the conductive metallic runs only along one side of the array. The disadvantage of a somewhat increased physical area occupied by the array is offset by a significant speed increase.

In operation, the data fields 749 and 769 network 712 are addressed with the same binary signal. Since the transistor locations are identical, each binary addressed field, effectively provides a low resistance path at both ends of the column conductors adjacent open circuit or "gap" in the network. The configuration illustrated produces a logic array having increased speed characteristics due to a substantial reduction of the resistance of the network.

Although the invention has been particularly shown and described with reference to a preferred embodiment thereof, it will be understood that various changes in form and detail may be made without departing from the scope and spirit of the invention as defined by the following claims.

What is claimed is:

1. A logic array including a plurality of addressable row conductors, a plurality of column conductors each having a resistive value, a first one of said column conductors being an output conductor and terminated at a first end by a first "pull-up" circuit including a first resistance, a second one of said column conductors being a return conductor and connected to a supply reference potential to provide a supply return for current flow through the array and a plurality of selectively positioned transistors responsive to the signals on said row conductors for selectively providing a conductive path between said first and said column conductors characterized by:
   a second supply reference potential connection at a second end of said second column conductor.

2. The logic array of claim 1 further characterized by:
   a second "pull-up" circuit including a second resistance connected to a second end of said first conductor.

3. The logic array of claims 1 or 2 characterized by:
   the array being constructed in accordance with metal oxide silicon technology with said column conductors being spaced elongated doped regions, said row conductors being spaced metallic runs and said transistors being field-effect transistors.

4. The logic array of claim 3 where said column conductors and said row conductors are arranged in a substantially rectangular pattern, the logic array being further characterized by:
   a plurality of conductors positioned along a portion of the periphery of the array and serving to connect the array to selected voltages for said first and second "pull-up" circuits and to the supply reference potential.

5. The logic array of claim 4 characterized by:

each of said "pull-up" circuits including a field-effect transistor biased to provide a load resistance which forms an impedance ratio with the resistance of the logic network of the array and at least selected ones of said conductors carrying bias voltages for said first and second "pull-up" circuits.

6. The logic array of claim 5 characterized by:
at least one of said conductors providing a return path to the supply reference potential from the ends of said second conductor.

7. The logic array of claim 6 further characterized by:
said conductor about the periphery of the array being metallic runs.

8. The logic array of claims 1 or 2 wherein said column conductors and said row conductors are arranged in a substantially rectangular pattern, the logic array being further characterized by:
a plurality of conductors positioned along a portion of the periphery of the array providing the necessary voltages to said first and second "pull-up" circuits and said power supply reference potential.

9. The logic array of claims 1 or 2 characterized by the logic array including a pair of similar binary address sections and a third decoder address section, said binary address sections being addressed by the same binary signal and defining a conductive "gap" across a pair of adjacent column conductors, said decoder addressed section being located between said binary address section and selectively closing said "gap", said binary address sections providing a relatively low impedance path between said first and second "pull-up" circuits and power supply return connections and said pair of adjacent column conductors.

10. The logic array of claim 9 characterized by:
the array being constructed in accordance with metal oxide silicon technology with said column conductor being spaced elongated doped regions, said row conductor being spaced metallic rows and said transistors being field-effect transistors.

* * * * *